United States Patent [19]
Inoue

[11] Patent Number: 5,349,318
[45] Date of Patent: Sep. 20, 1994

[54] DOUBLE TYPE COIL FOR GENERATING SLANT MAGNETIC FIELD FOR MRI

[75] Inventor: Yuji Inoue, Tokyo, Japan

[73] Assignee: GE Yokogawa Medical Systems, Limited, Tokyo, Japan

[21] Appl. No.: 39,013

[22] PCT Filed: Oct. 3, 1991

[86] PCT No.: PCT/JP91/01344
§ 371 Date: Mar. 26, 1993
§ 102(e) Date: Mar. 26, 1993

[87] PCT Pub. No.: WO92/05737
PCT Pub. Date: Apr. 16, 1992

[51] Int. Cl.$^5$ .............................................. G01R 33/20
[52] U.S. Cl. ...................................... 335/299; 324/318
[58] Field of Search ...................... 335/216, 213, 299; 324/318, 319, 320

[56] References Cited
U.S. PATENT DOCUMENTS 4,456,881  6/1984  Compton ............................... 324/319
4,871,969 10/1989  Roemer et al. ....................... 324/319

Primary Examiner—Leo P. Picard
Assistant Examiner—Raymond Barrera
Attorney, Agent, or Firm—Moonray Kojima

[57] ABSTRACT

The invention realizes a double type coil used as a slant coil to generate a slant magnetic field for MRI, and the double type coil has small impedance and short length in comparison with the prior art. According to the invention, current path patterns constituted by a current path in spiral shape and a plurality of current paths in horseshoe shape surrounding the spiral path are formed respectively on the double semi-cylinder surfaces having the axis commonly. Directions of spirals on the two cylinder surfaces are opposite to each other. In the plural horseshoe-shaped paths on the two cylinder surfaces, a circuit is opened at the end on the same side of the cylinder. These current paths are all connected in series over the two surfaces thereby one current path is formed.

3 Claims, 5 Drawing Sheets

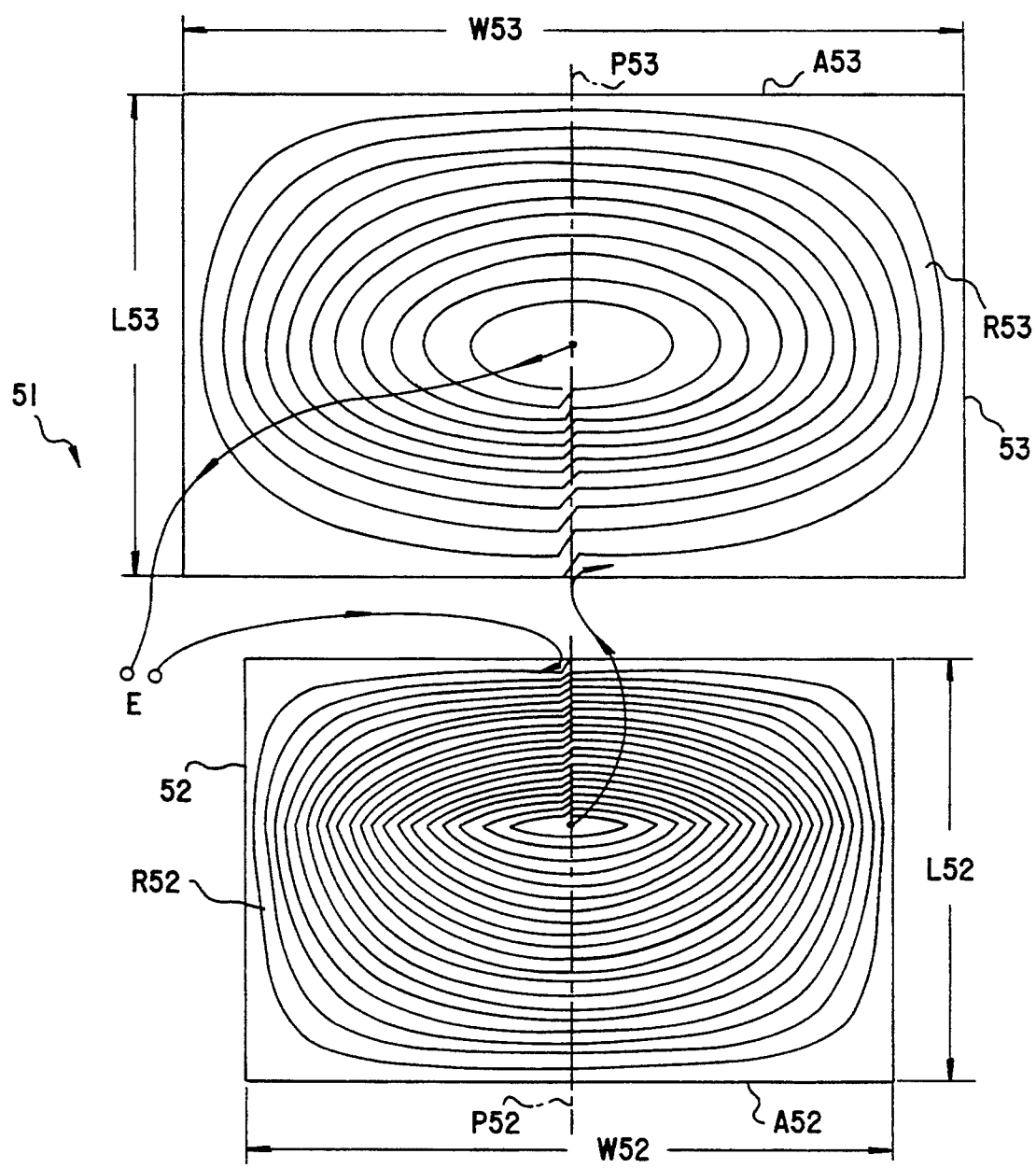

DOUBLE TYPE COIL FOR GENERATING SLANT MAGNETIC FIELD FOR MRI

TECHNICAL FIELD

The present invention relates to a double type coil for generating a slant magnetic field for MRI. The double type coil for generating a slant magnetic field for MRI comprises an inner coil and an outer coil, and at the inside space of the inner coil, a slant magnetic field is generated, but at the outside space of the outer coil, a magnetic field is not actually generated due to magnetic fields in opposite directions to each other generated by both coils. Regarding such a double type coil, the present invention intends that impedance is lowered in comparison with the prior art, and coil length is shortened and an equivalent slant magnetic field can be generated.

BACKGROUND ART

As a conventional example of a double type coil for generating a slant magnetic field for MRI, a slant coil apparatus is disclosed in JPB No. 194842/1987. FIG. 8 is a plan development of the slant coil apparatus.

The slant coil apparatus 51 is constituted by an inner coil 2 having coil width of W52 and coil length of L52, and an outer coil 53 having coil width of W53 and coil length of L53. Each of current paths R52, R53 of the inner coil 52 and the outer coil 53 is of spiral shape. In the plan development state, each spiral of the current paths R52, R53 takes shape of winding clockwise. These current paths are formed, for example, by etching a conduction layer of a flexible print board. In relation that a current path part at the utmost inside of the spiral of the inner coil 52 is connected to a current path part at the utmost outside of the spiral of the outer coil 53, both coils 52, 53 are connected in series and current flows from the power source E in the arrow direction. Dash-and-dot lines P52, P53 show the center lines of the coil widths W52, W53.

Each of sides A52 and A53 and the center lines P52 and P53 are aligned, and the inner coil 52 and the outer coil 53 are spaced by a definite distance and overlaid, and then curved into two, inner and outer, nearly coaxial semi-cylinders with the coil widths W52, W53 being made semi-circumferential lengths respectively thereby a double type coil is formed. In such overlaid state, the inner coil 52 and the outer coil 53 are opposite to each other in the direction of the spiral of the current paths. Patterns of the current paths R52, R53 are formed, so that when current flows there, a slant magnetic field is generated in the inside space of the inner coil 52 and the leakage magnetic field is made approximately zero in the outside apace of the outer coil 53.

The coil width W52 and the coil length L52 of the inner coil 52 are, for example, 1036 mm and 640 mm respectively, and the coil width W53 and the coil length L53 of the outer coil 53 are, for example, 1224 mm and 710 mm respectively.

As shown in FIG. 9, four sets of the slant coil apparatuses 51 are mounted on circumferential surfaces of two inner and outer bobbins 55, 56 constituted in nearly coaxial cylinder shape in symmetry with respect to the center cross-section of the bobbin thereby a lateral slant coil apparatus for MRI is formed. The inner coil 52 is mounted on the inside bobbin 55 and the outer coil 53 is mounted on the outside bobbin 56 respectively, the sides A52, A53 being directed to the symmetry surface.

In the above-mentioned slant coil apparatus 51 in the prior art, the current paths R52, R53 of the inner coil 52 and the outer coil 53 are in spiral shape respectively, and each of the inner coil 52 and the outer coil 53 has a current path part to form a desired magnetic field (hereinafter referred to as "main path") and a current path part only to return a current (hereinafter referred to as "return path").

In FIG. 8, in the inner coil 52, a lower half from the center of the spiral of the spiral current path R52 is a main path and an upper half is a return path, and in the outer coil 53, an upper half from the center of the spiral of the spiral current path R53 is a main path and a lower half is a return path. Therefore, a problem exists in that the whole current path becomes long and the impedance becomes high uselessly, and the response speed becomes slow and the drive power is increased.

Also since the coil lengths L52, L53 become long and the electromagnetic force generated by the coil becomes large, a problem exists in that noise attendant on switching of the slant magnetic field increases.

Disclosure of Invention

An object of the present invention is to provide a double type coil where impedance can be lowered and coil length can be shortened.

According to the present invention, on double semi-circular cylinders having the axis commonly, a current path pattern comprising a current path in spiral shape and a plurality of current paths in horseshoe shape surrounding the spiral current path is formed respectively. Directions of the spirals on the two cylindrical surfaces are opposite to each other. In the plural horseshoe-shaped paths on the two cylindrical surfaces, a circuit is opened at the end on the same side of the cylinder. These current paths are all connected in series over the two surfaces thereby one current path is formed.

BRIEF DESCRIPTION OF DRAWINGS

FIG. 8 is a plan development of an example of a double type coil in the prior art.

BEST MODE FOR CARRYING OUT THE INVENTION

The present invention will be described further in detail based on embodiments shown in the accompanying drawings as follows. The present invention is not limited by the embodiments.

Figure 1:
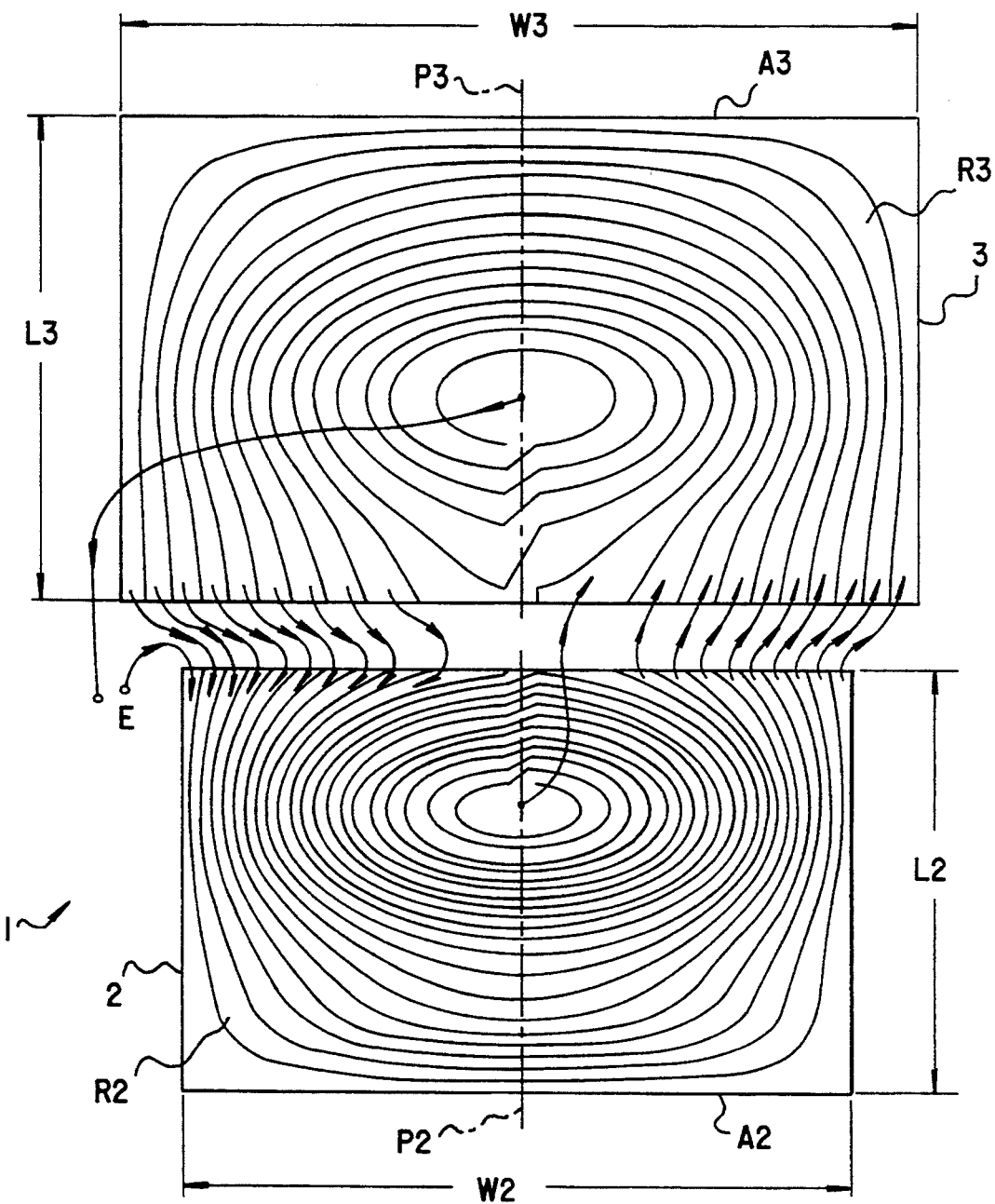
FIG. 1 is a plan development of a double type coil in an embodiment of the invention.

FIG. 1 is a plan development of a double type coil in an embodiment of the present invention.

The double type coil 1 is constituted by an inner coil 2 having coil width of W2 and coil length of L2, and an outer coil 3 having coil width of W3 and coil length of L3. Dash-and-dot lines P2, P3 show the center lines of the coil widths.

Respective current paths R2, R3 of the inner coil 2 and the outer coil 3 are constituted by a path in spiral shape and a plurality of paths in horseshoe shape surrounding the outside of the spiral path in multiplicity. Such a current path is formed, for example, by etching a conduction layer of a flexible print board. In the plan development, any spiral of the current paths R2, R3 takes shape of winding counterclockwise. The current paths in horseshoe shape of the inner coil 2 and the outer coil 3 are mutually connected in series so that a large spiral of winding counterclockwise over the inner coil 2 and the outer 3 is formed, and the end of the utmost inside path in horseshoe shape of the outer coil 3 is connected to the utmost outside path in spiral shape of the inner coil 2. In such form, all paths of the two coils are connected in series and become one current path, and current is supplied from the power source E. In the inner coil 2, a current path in a lower half from the center of the spiral constitutes a main path, and in the outer coil 3, a current path in an upper half from the center of the spiral constitutes a main path.

Each of sides A2 and A3 and the center lines P2 and P3 are aligned, and the inner coil 2 and the outer coil 3 are spaced a definite distance and overlaid, and then curved into two inner and outer coaxial semi-circular cylinders with the coil widths W2, W3 being made semi-circumferential lengths thereby a double type coil is formed. In such constitution, respective main paths are mutually overlaid, and current flowing through the current path R2 of the inner coil 2 and current flowing through the current path R3 of the outer coil 3 are opposite to each other in the direction. In such state, patterns of the current paths R2, R3 are formed so as to satisfy following basic conditions (1), (2), (3) and current distribution condition (4).

(1) A slant magnetic field is generated in the inside space of the inner coil 2.

(2) A leakage magnetic field is made zero in the outside space of the outer coil 3.

(3) Total sum of all currents of the inner coil 2 and all currents of the outer coil 3 is made zero.

Figure 2:
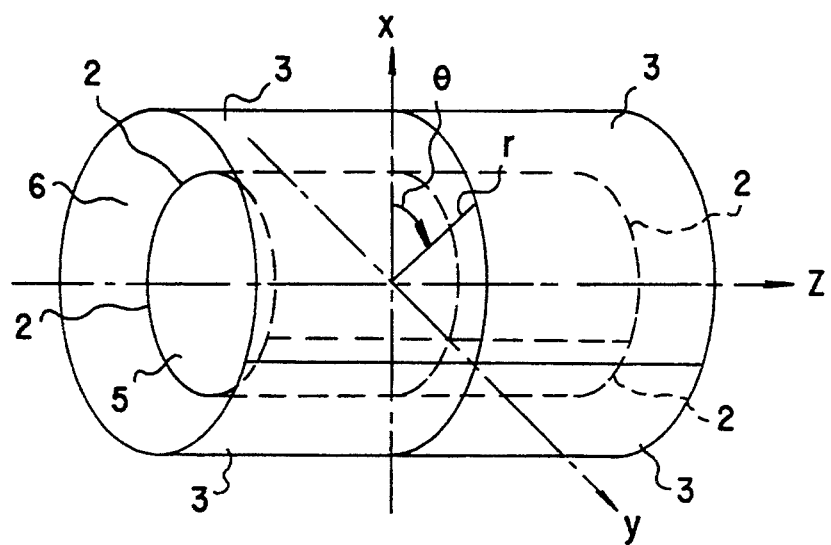
FIG. 2 is a perspective view of a lateral slant coil apparatus constituted using four sets of double type coils in an embodiment of the invention.

(4) $J\phi(\theta, z) = \{\Sigma an \cdot \cos(n\pi) + bn \cdot \sin(n\pi)\} \cdot \cos(\theta)^m$ Where coordinate axes of $\theta$ and z in the case of an x slant coil are taken as in FIG. 2.

In the embodiment of FIG. 1, if the same slant magnetic field as the example in the prior art of FIG. 8 is generated, the coil width W2 and the coil length L2 of the inner coil 2 are 1036 mm and 525 mm respectively, and the coil width W3 and the coil length L3 of the outer coil 3 are 1224 mm and 625 mm respectively.

Four sets of the double type coils 1, with the utmost outside paths of respective main paths being mutually opposed, are mounted on circumferential surfaces of two inner and outer bobbins 5, 6 constituted in nearly coaxial cylinders in symmetry with respect to the center cross-section of the bobbin as shown in FIG. 2 thereby a lateral slant coil apparatus for MRI is formed. The inner coil 2 is mounted on the inside bobbin 5 and the outer coil 3 is mounted on the outside bobbin 6 respectively, the sides A2, A3 being directed to the symmetry surface. In FIG. 2, x, y, z indicate the orthogonal coordinate system, and r, $\theta$, z indicate the cylindrical coordinate system. The z-axis is coincident with the axis of the coaxial cylinder.

Figure 3:
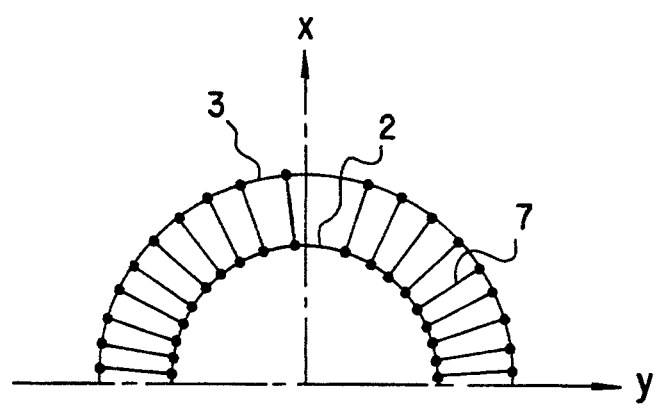
FIG. 3 is a concept diagram of connection of an inner coil and an outer coil regarding an embodiment of the invention.

FIG. 3 shows connection of the inner coil 2 and the outer coil 3 in concept. A connection wire 7 is a wire made of conductor for example, and is connected to the current paths of the inner coil 2 and the outer coil 3 by means of soldering or the like.

Figure 4:
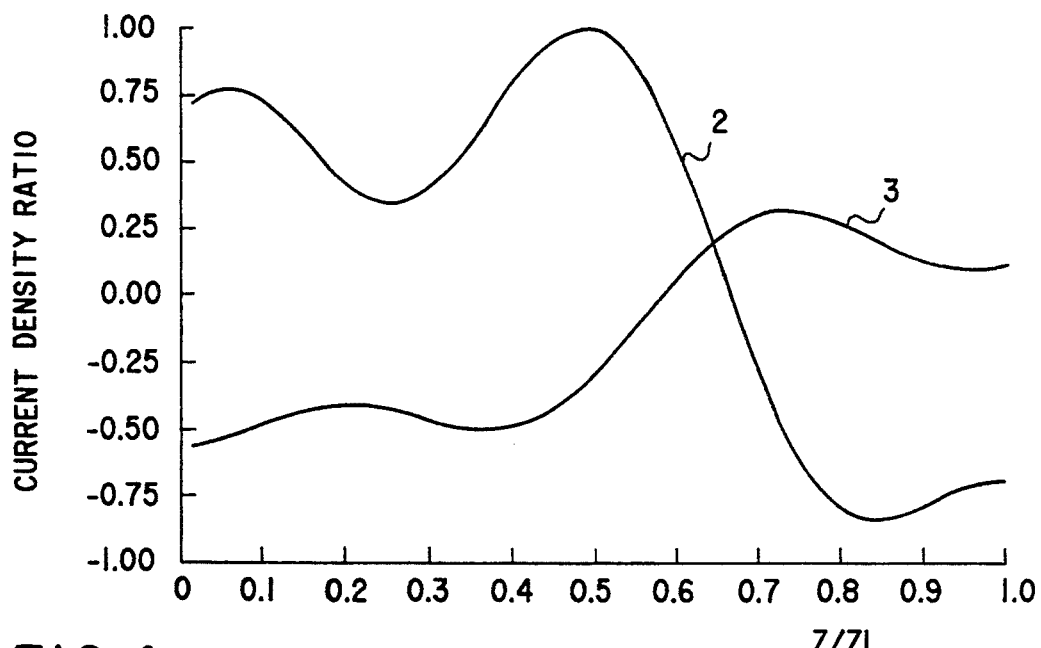
FIG. 4 is a characteristic diagram of current distribution of a double type coil in an embodiment of the invention.

FIG. 4 is a distribution characteristic diagram of the current density ratio of the inner coil 2 and the outer coil 3 regarding the z-axis direction.

Figure 5:
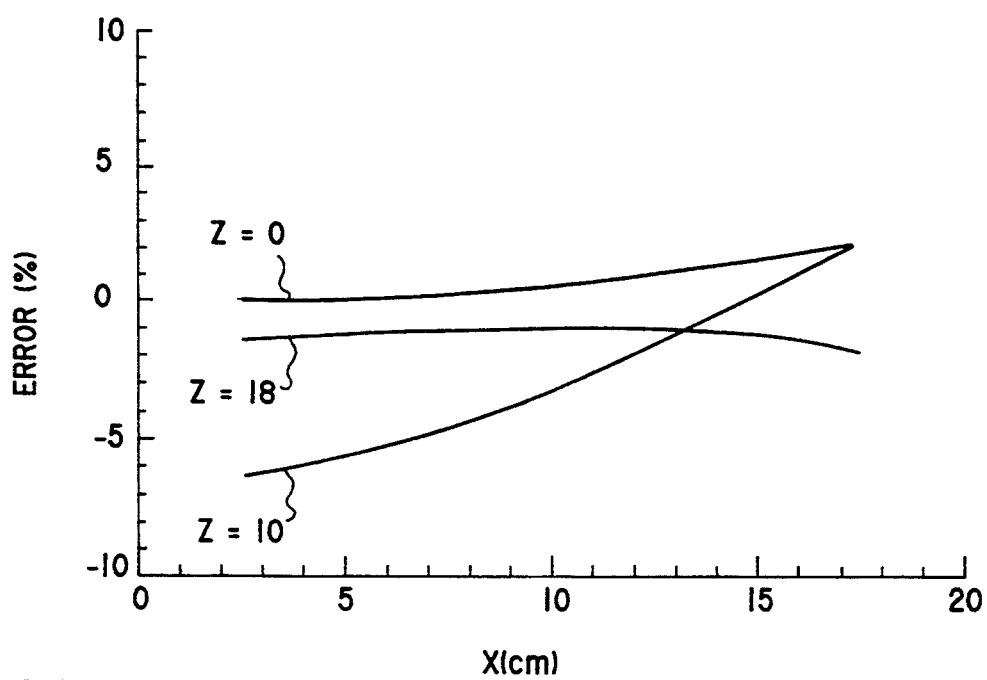
FIG. 5 is a characteristic diagram of a slant magnetic field of a double type coil in an embodiment of the invention.

FIG. 5 is a characteristic diagram of linearity of a slant magnetic field of the double type coil 1.

Figure 6:
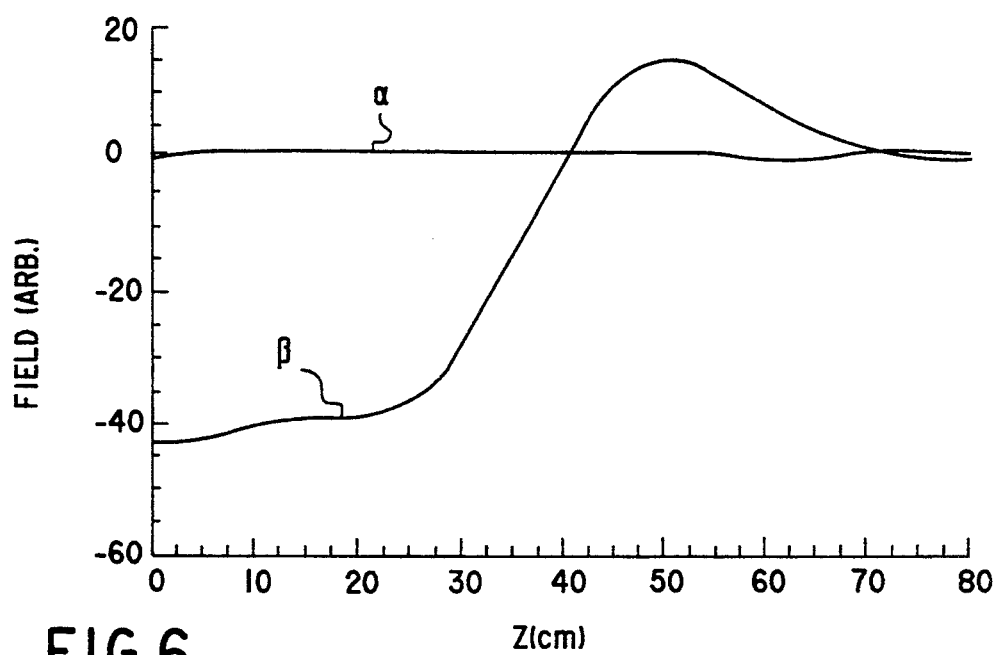
FIG. 6 is a characteristic diagram of a leakage magnetic field of a double type coil in an embodiment of the invention.

FIG. 6 is a distribution characteristic diagram of a leakage magnetic field in an imaginary cylinder surface of radius 475 mm outside the outer coil 2 regarding the z-axis direction. Leakage magnetic field plot in the case of forming a magnetic field by the double type coil 1 is shown by curve $\alpha$, and leakage magnetic plot in the case of forming a magnetic field by only the inner coil 2 is shown by curve $\beta$. It is seen that the large leakage magnetic field in the case of forming the magnetic field by only the inner coil 2 becomes quite small by the double type coil 1. The leakage magnetic field shown by curve $\alpha$ is comparable with the leakage magnetic field in the prior art apparatus of FIG. 8.

In order to clarify advantages of the double type coil according to the present invention, comparison results by the embodiment with the double type coil in the prior art of FIG. 8 are shown as follows.

(1) coil resistance: When a current path is manufactured by etching a copper plate with thickness of 0.6 mm, it becomes 0.95 $\Omega$ in the prior art but becomes 0.66 $\Omega$ in the embodiment of the present invention.

(2) coil inductance: It becomes 0.8 mH in the prior art but becomes 0.65 mH in the embodiment of the present invention.

(3) coil length: It becomes 1.28 m in the inner coil and becomes 1.42 m in the outer coil in the prior art, but it becomes 1.05 m in the inner coil and becomes 1.25 m in the outer coil in the embodiment of the present invention.

Since the impedance is reduced as above described, high speed drive becomes possible and a slant magnetic field with high through rate can be generated. Also the drive power to generate the slant magnetic field is decreased.

Figure 7:
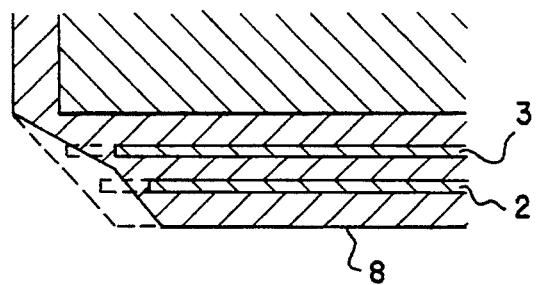
FIG. 7 is a sectional view showing structure in the vicinity of an entrance of a static field magnet using a double type coil in an embodiment of the invention.
Figure 9:
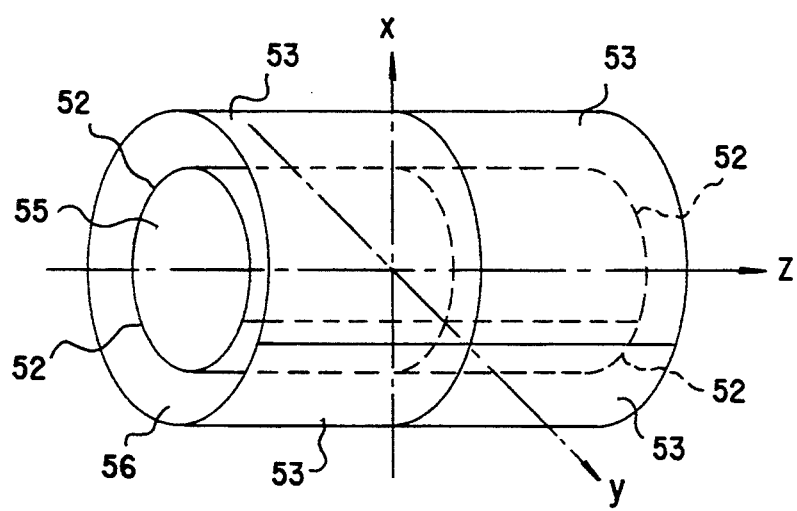
FIG. 9 is a perspective view of a lateral slant coil apparatus for MRI using a double type coil in the prior art.

Further since the electromagnetic force applied to the bobbin becomes small as the coil length becomes short, noise attendant on the switching of the slant magnetic field can be reduced. Moreover since length of the bobbin can be shortened as the coil length becomes short, in the static field magnet on which the slant magnetic field coil is mounted, an opening portion at its entrance can be widened in comparison with that in the prior art. That is, edge of the opening portion at the entrance of the static field magnet can be made shape having inclination deep to the interior as shown in FIG. 7, and sense of oppression given to a patient can be reduced in comparison with the case using the slant coil in the prior art where the edge is pushed out to the front side as shown in dotted line.

What is claimed is:

1. A double type coil comprising:

a first coil with a current path formed on a substantially semi-circular cylinder surface, said current path being constituted by a path in spiral shape and a plurality of paths in horseshoe shape surrounding the outside of the spiral path, one end of the spiral and both ends of the plural horeseshoe-shaped paths being aligned at one end of the semi-cylinder;

a second coil with a current path formed on a semi-cylinder surface formed coaxial to the outside of the first coil, said current path being constituted by a path in spiral shape wound in opposite direction to the spiral of the current path of said first coil and a plurality of paths in horseshoe shape surrounding the outside of the spiral path, one end of the spiral path and both ends of the plural horseshoe-shaped paths being aligned at one end of the semi-cylinder; and connection means for connecting all current paths in series over the first coil and the second coil and for forming one current path.

2. A double type coil as set forth in claim 1, wherein the first coil and the second coil are combined in aligning in opposite end to the side in which both ends of the plural horseshoe-shaped paths are aligned.

3. A slant magnetic field coil apparatus where four sets of double type coils each in substantially semi-circular cylinder shape are arranged in symmetry having the axis of the cylinders in common, each double type coil comprising:

a first coil with a current path formed on a substantially semi-circular cylinder surface, said current path being constituted by a path in spiral shape and a plurality of paths in horseshoe shape surrounding the outside of the spiral path, one end of the spiral path and both ends of the plural horseshoe-shaped paths being aligned at one end of the semi-cylinder;

a second coil with a current path formed on a semi-cylinder surface formed coaxial to the outside of the first coil, said current path being constituted by a path in spiral shape wound in opposite direction to the spiral of the current path of said first coil and a plurality of paths in horseshoe shape surrounding the outside of the spiral path, one end of the spiral path and both ends of the plural horseshoe-shaped paths being aligned at one end of the semi-cylinder; and connection means for connecting all current paths in series over the first coil and the second coil and for forming one current path, wherein the first coil and the second coil are combined in aligning in opposite end to the side in which both ends of the plural horseshoe-shaped paths are aligned.

* * * * *